(12) United States Patent
Jung et al.

(10) Patent No.: US 12,248,018 B2
(45) Date of Patent: Mar. 11, 2025

(54) SEMICONDUCTOR CHIP AND TEST METHOD OF THE SAME

(71) Applicant: Samsung Electronics Co., Ltd., Suwon-si (KR)

(72) Inventors: Yeon Ho Jung, Suwon-si (KR); Jong Wook Kye, Suwon-si (KR); Min Woo Kwak, Seoul (KR); Mi Joung Kim, Hwaseong-si (KR); Chan Wook Park, Seongnam-si (KR); Do Hoon Byun, Hwaseong-si (KR); Kwan Seong Lee, Yongin-si (KR); Jae Ho Lee, Incheon (KR); Jae Seung Choi, Hwaseong-si (KR); Hwang Ho Choi, Busan (KR)

(73) Assignee: Samsung Electronics Co., Ltd. (KR)

( * ) Notice: Subject to any disclaimer, the term of this patent is extended or adjusted under 35 U.S.C. 154(b) by 148 days.

(21) Appl. No.: 18/047,366

(22) Filed: Oct. 18, 2022

(65) Prior Publication Data

US 2023/0176112 A1 Jun. 8, 2023

(30) Foreign Application Priority Data

Dec. 3, 2021 (KR) .......................... 10-2021-0171427

(51) Int. Cl.
*G01R 31/28* (2006.01)
*G01R 31/30* (2006.01)
*H03K 3/011* (2006.01)
*H03K 3/03* (2006.01)

(52) U.S. Cl.
CPC ..... *G01R 31/2856* (2013.01); *G01R 31/3004* (2013.01); *H03K 3/011* (2013.01); *H03K 3/0315* (2013.01)

(58) Field of Classification Search
CPC ............ G01R 31/2856; G01R 31/3004; G01R 19/16552; H03K 3/011; H03K 3/0315
See application file for complete search history.

(56) References Cited

U.S. PATENT DOCUMENTS 5,357,217 A * 10/1994 Marchesi ............. H03K 3/0315
331/172
7,123,104 B2 10/2006 Bostak et al.
7,449,961 B2 * 11/2008 Sai ........................ H03L 7/0995
331/2

(Continued)

FOREIGN PATENT DOCUMENTS

| JP | H09133719 A | 5/1997 |
| JP | 2004146612 A | 5/2004 |
| JP | 2009071160 A | 4/2009 |

*Primary Examiner* — Akm Zakaria
(74) *Attorney, Agent, or Firm* — Myers Bigel, P.A.

(57) ABSTRACT

A semiconductor chip includes a semiconductor device connected between a first node to which a power supply voltage is applied and a second node to which a ground voltage is applied, a first ring oscillator connected to the first node through a first supply switch and the second node through a first ground switch and a second ring oscillator connected to the first node through a second supply switch and the second node through a second ground switch, wherein the first supply and ground switches are configured to operate in response to a first control signal, thereby operating the first ring oscillator, and the second supply and ground switches are configured to operate in response to a second control signal, thereby operating the second ring oscillator.

17 Claims, 16 Drawing Sheets

(56) References Cited

U.S. PATENT DOCUMENTS

| | | | |
|---|---|---|---|
| 7,902,844 B2 | 3/2011 | Matsunaga | |
| 8,615,767 B2 | 12/2013 | Singh et al. | |
| 9,383,407 B2 | 7/2016 | Bhatia | |
| 10,527,503 B2 | 1/2020 | Fritchman et al. | |
| 10,671,784 B2 | 6/2020 | Wang et al. | |
| 10,819,317 B1 * | 10/2020 | Lahiri | H03K 3/0315 |
| 2007/0052483 A1 * | 3/2007 | Dietl | H03K 3/0315 |
| | | | 331/2 |
| 2017/0141762 A1 * | 5/2017 | Uemura | G01R 31/2601 |
| 2018/0248555 A1 * | 8/2018 | Jenkins | H03B 5/36 |
| 2019/0068174 A1 * | 2/2019 | Lu | H03K 3/0322 |

* cited by examiner

SEMICONDUCTOR CHIP AND TEST METHOD OF THE SAME

CROSS-REFERENCE TO RELATED APPLICATIONS

This application claims priority under 35 U.S.C. § 119 to Korean Patent Application No. 10-2021-0171427 filed on Dec. 3, 2021, the disclosure of which is hereby incorporated by reference in its entirety.

BACKGROUND

The present disclosure relates to a semiconductor chip and a test method of the semiconductor chip. Specifically, the present disclosure relates to a semiconductor chip including ring oscillators.

A semiconductor chip may include a plurality of semiconductor devices, and the semiconductor devices may perform different functions from each other. When designing the semiconductor chip, an IR drop on the semiconductor device may occur. The IR drop means that when a current flows through the semiconductor device, a voltage drop occurs. Information about the IR drop may be used when circuit designers design the semiconductor chip.

However, when probing of the IR drop is performed on the semiconductor chip, damage to silicon may occur. Further, when the IR drop is derived for the semiconductor chip, power may be consumed. Therefore, there is a need for a method for measuring the IR drop of the semiconductor chip without a separate probing device or power separation for the semiconductor chip.

SUMMARY

Aspects of the present disclosure provide a semiconductor chip for measuring an IR drop of a semiconductor device.

Aspects of the present disclosure also provide a test method of the semiconductor chip for measuring the IR drop of the semiconductor device.

One embodiment of the present disclosure provides a semiconductor chip including a semiconductor device connected between a first node to which a power supply voltage is applied and a second node to which a ground voltage is applied, a first ring oscillator connected to the first node through a first supply switch and the second node through a first ground switch and a second ring oscillator connected to the first node through a second supply switch and the second node through a second ground switch, wherein the first supply and ground switches are configured to operate in response to a first control signal, thereby operating the first ring oscillator, and the second supply and ground switches are configured to operate in response to a second control signal, thereby operating the second ring oscillator.

Another embodiment of the present disclosure provides a test method of a semiconductor chip, the method including providing a semiconductor chip including a first semiconductor device connected between a first node and a second node, a first ring oscillator connected to the first node and the second node and a second ring oscillator connected to the first node and the second node, outputting a first current flowing through the first semiconductor device and the first ring oscillator, and a first frequency of a signal output from the first ring oscillator, in response to application of a first test voltage to the first node and application of a ground voltage to the second node, outputting a second current flowing through the first semiconductor device, the first ring oscillator, and the second ring oscillator, and a second frequency of a signal output from the second ring oscillator, in response to application of a second test voltage to the first node and application of the ground voltage to the second node, and calculating an IR drop on the first semiconductor device, on the basis of the first test voltage, the second test voltage, the first current, the second current, the first frequency, and the second frequency.

Another embodiment of the present disclosure provides a semiconductor chip including a semiconductor device, an IR drop measurer including a plurality of ring oscillators connected to the semiconductor device and a process deviation monitoring circuit spaced apart from the semiconductor device and the plurality of ring oscillators, wherein when a frequency of a signal output from a first ring oscillator among the plurality of ring oscillators is a first frequency, the IR drop measurer is configured to output a first voltage applied to the semiconductor device and the first ring oscillator, and a flowing first current, and the process deviation monitoring circuit is configured to output a signal having a second frequency different from the first frequency in response to the applied first voltage.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

DETAILED DESCRIPTION

Hereinafter, embodiments according to the technical idea of the present disclosure will be described referring to the accompanying drawings.

Figure 1:
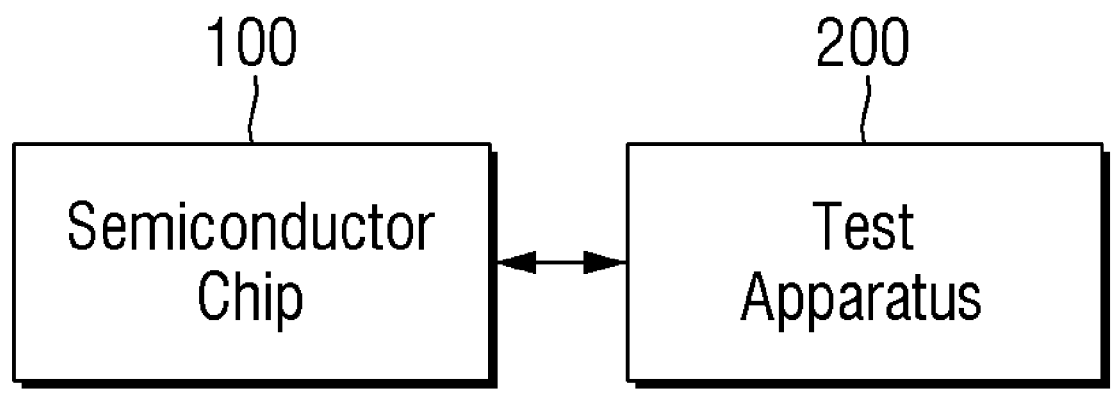
FIG. 1 is a block diagram of a semiconductor chip test system according to some embodiments.
Figure 2:
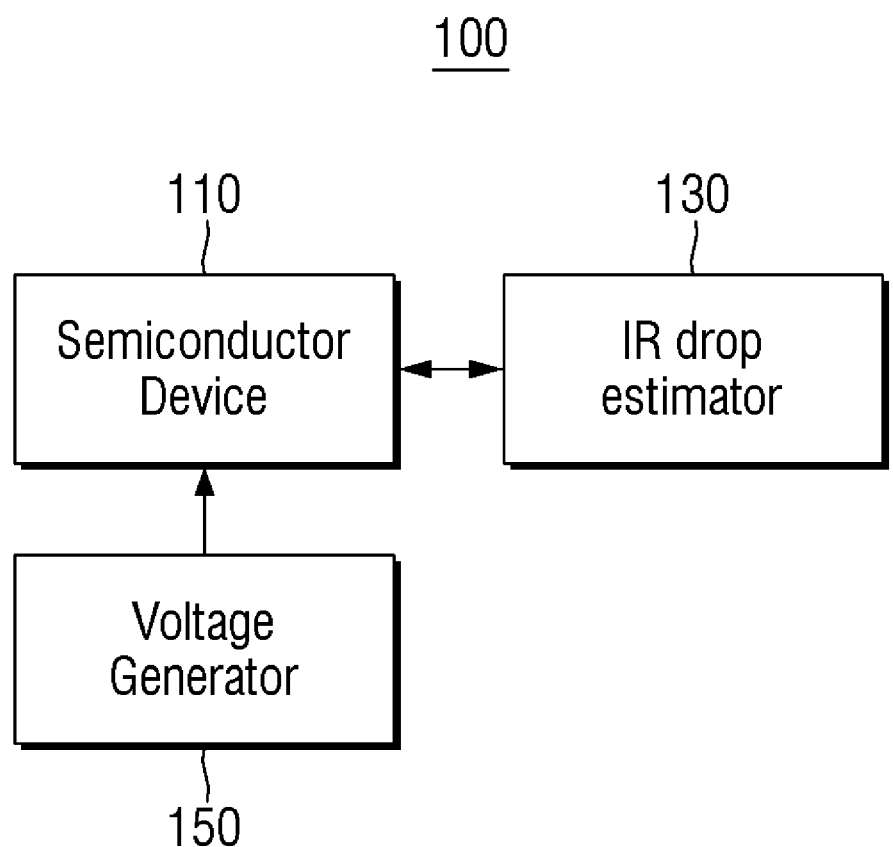
FIG. 2 is a block diagram of the semiconductor chip of FIG. 1.

FIG. 1 is a block diagram of a semiconductor chip test system according to some embodiments. FIG. 2 is a block diagram of the semiconductor chip of FIG. 1.

Referring to FIG. 1, the semiconductor chip test system may include a semiconductor chip 100 and a test apparatus 200. The test apparatus 200 may test the semiconductor chip 100. Here, the semiconductor chip 100 may correspond to a semiconductor chip whose production has been completed, or may correspond to a semiconductor chip in which production has not been completed and is being produced. The semiconductor chip 100 may include, for example, an application processor, a Central Processing Unit (CPU), a Graphics Processing Unit (GPU), a flash memory chip, a Dynamic Random Access Memory (DRAM) chip, and the like. However, embodiments of the present disclosure are not limited thereto, and the semiconductor chip 100 may include a semiconductor chip for another purpose.

The test apparatus 200 is connected to the semiconductor chip 100 and may perform a test on the semiconductor chip 100. For example, the test apparatus 200 may perform a test to determine whether the semiconductor chip 100 is operating. Further, the test apparatus 200 may measure an IR drop on a device that performs a function inside the semiconductor chip 100, and may perform a feedback, using the measured IR drop. The test apparatus 200 may receive data from the semiconductor chip 100, and may analyze the received data. For example, the test apparatus 200 may analyze the data from the semiconductor chip 100 and provide the feedback to the semiconductor chip 100.

Referring to FIG. 2, the semiconductor chip 100 may include a semiconductor device 110, an IR drop estimator or measurer 130 (which may also be referred to herein as an IR drop measurement device), and a voltage generator 150.

The semiconductor device 110 may perform one function inside the semiconductor chip 100. For example, the semiconductor device 110 may include a Static Random Access Memory (SRAM). The voltage generator 150 may provide the generated voltage to the semiconductor device 110. Further, the voltage generator 150 may provide the generated voltage to the IR drop measurer 130. The voltage generated here may vary depending on the situation.

The IR drop measurer 130 may measure the IR drop on the semiconductor device 110. The IR drop may mean a voltage value that drops by the current flowing through the semiconductor device 110. The IR drop measurer 130 may measure a voltage value that drops by the semiconductor device 110. For example, the IR drop measurer 130 may output data including the result of performing the measurement on the semiconductor device 110.

Figure 3:
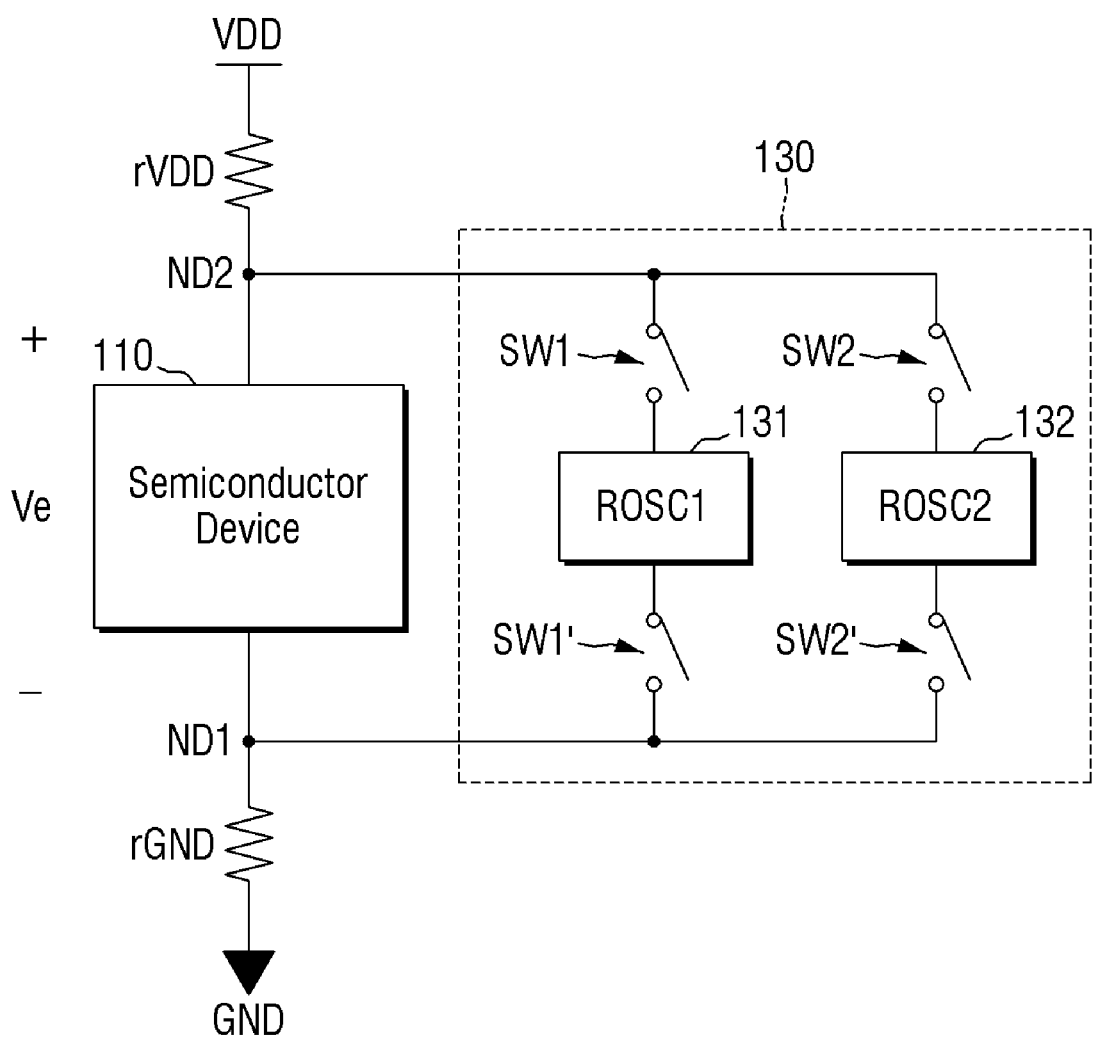
FIG. 3 is a diagram of a semiconductor device and an IR drop measurer according to some embodiments.

FIG. 3 is a diagram of the semiconductor device and the IR drop measurer according to some embodiments.

Referring to FIG. 3, the semiconductor device 110 may be connected between a first node ND1 and a second node ND2. Here, the semiconductor device 110 may be a unit that performs one function in the semiconductor chip 100. A ground resistance rGND may be connected between the first node ND1 and the ground voltage GND. A power supply resistance rVDD may be connected between the second node ND2 and the power supply voltage VDD. Here, the ground resistance rGND and the power supply resistance rVDD may correspond to a resistance that is dependent on the ground voltage GND and the power supply voltage VDD. When designing the semiconductor chip 100, the designer may not know the values of the ground resistance rGND and the power supply resistance rVDD.

The voltage generator 150 (FIG. 2) may provide the power supply voltage VDD and the ground voltage GND to the semiconductor device 110. Specifically, the power supply voltage VDD may be provided at one end of the power supply resistance rVDD, and the ground voltage GND may be provided at one end of the ground resistance rGND. That is, the power supply voltage VDD and the ground voltage GND may be applied to the power supply resistance rVDD, the semiconductor device 110, and the ground resistance rGND that are connected in series. As a result, a measured voltage Ve may be applied to the semiconductor device 110. That is, the measured voltage Ve may be applied to the first node ND1 and the second node ND2. However, since the designer does not know the values of the ground resistance rGND and the power supply resistance rVDD, the measured voltage Ve may not be derived. Here, the measured voltage Ve may be referred to as an IR drop on the semiconductor device 110.

The IR drop measurer 130 may include a first ring oscillator 131, a second ring oscillator 132, a first switch or first supply switch SW1, a first switch or first ground switch SW1', a second switch or second supply switch SW2, and a second switch or second ground switch SW2'. Here, the first ring oscillator 131 and the second ring oscillator 132 may be connected in parallel.

The first ring oscillator 131, the first switch SW1 and the first switch SW1' may be connected between the first node ND1 and the second node ND2. That is, the first ring oscillator 131, the first switch SW1 and the first switch SW1' may be connected in parallel with the semiconductor device 110. Further, the first ring oscillator 131, the first switch SW1 and the first switch SW1' may be connected in series. That is, the first ring oscillator 131 may be connected between the first switch SW1 and the first switch SW1'. Therefore, the first ring oscillator 131 may or may not be connected to the semiconductor device 110, in accordance with the turning-on or turning-off (opening or closing) of the first switch SW1 and the first switch SW1'.

The second ring oscillator 132, the second switch SW2, and the second switch SW2' may be connected between the first node ND1 and the second node ND2. That is, the second ring oscillator 132, the second switch SW2, and the second switch SW2' may be connected in parallel with the semiconductor device 110. Therefore, the second ring oscillator 132, the second switch SW2 and the second switch SW2' may be connected in parallel with the first ring oscillator 131, the first switch SW1 and the first switch SW1'. Further, the second ring oscillator 132, the second switch SW2 and the second switch SW2' may be connected in series. That is, the second ring oscillator 132 may be connected between the second switch SW2 and the second switch SW2'. Therefore, the second ring oscillator 132 may or may not be connected to the semiconductor device 110, in accordance with the turning-on or turning-off (opening or closing) of the second switch SW2 and the second switch SW2'.

The first ring oscillator 131 and the second ring oscillator 132 may be operated by a controller inside the test apparatus 200 or the semiconductor chip 100. That is, when the first switch SW1 and the first switch SW1' are turned on, the first ring oscillator 131 may be operated by the measured voltage Ve. Further, when the second switch SW2 and the second switch SW2' are turned on, the second ring oscillator 132 may be operated by the measured voltage Ve. In other words, the controller may apply a first control signal to open and close the first switch SW1 and the first switch SW1', thereby controlling operation of the first ring oscillator 131. Similarly, the controller may apply a second control signal to open and close the second switch SW2 and the second switch SW2', thereby controlling operation of the second ring oscillator 132.

Figure 4:
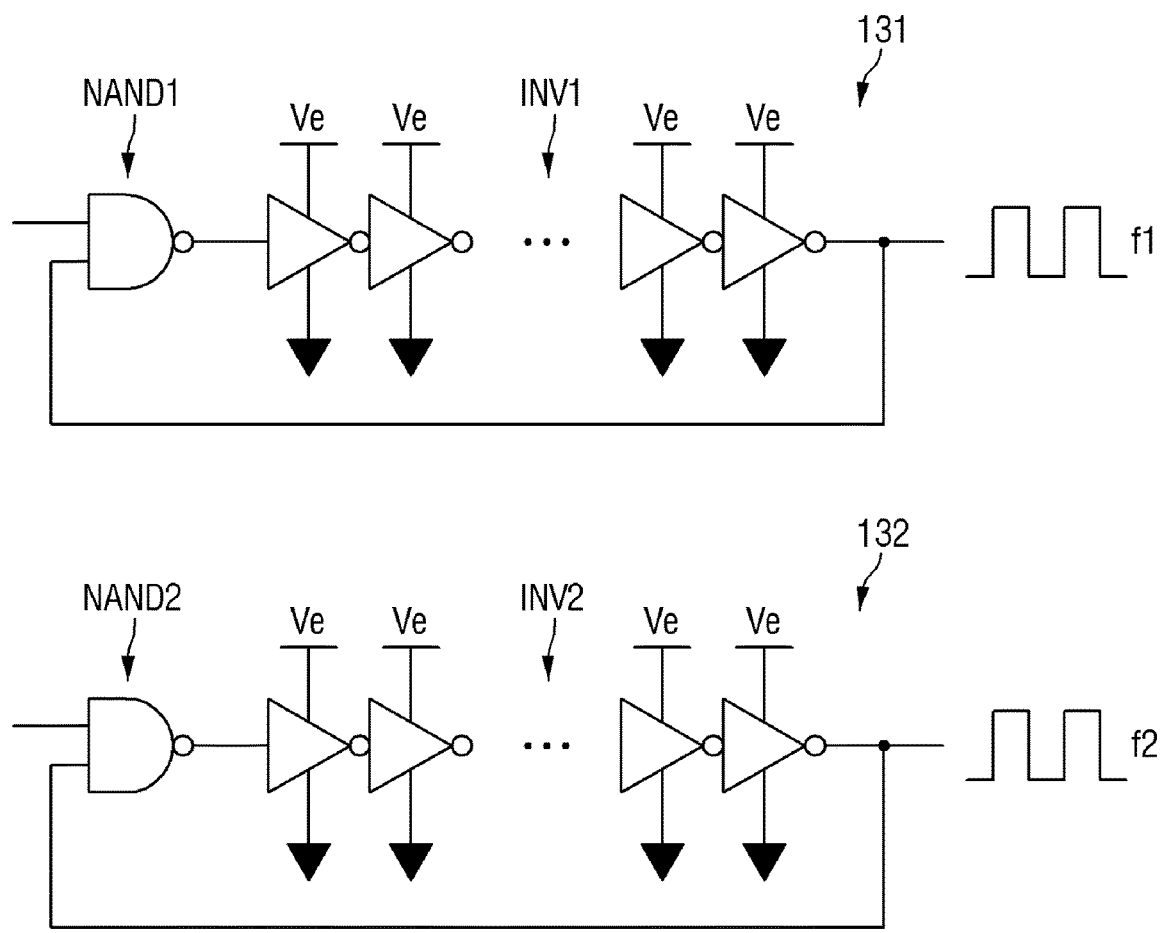
FIG. 4 is a diagram of the first ring oscillator and the second ring oscillator of FIG. 3.

FIG. 4 is a diagram of the first ring oscillator 131 and the second ring oscillator 132 of FIG. 3.

Referring to FIG. 4, the first ring oscillator 131 may include a first NAND computation element NAND1 and a plurality of first inverters INV1 connected in series. Here, the plurality of first inverters INV1 may operate on the basis of the measured voltage Ve. The signal passing through the first ring oscillator 131 may be delayed by the plurality of first inverters INV1, and may have a particular waveform, accordingly. That is, the signal that is output from the first ring oscillator 131 may have a first frequency f1.

The second ring oscillator 132 may include a second NAND computation element NAND2 and a plurality of second inverters INV2 connected in series. Here, the plurality of second inverters INV2 may operate on the basis of the measured voltage Ve. The signal passing through the second ring oscillator 132 may be delayed by the plurality of second inverters INV2, and may have a particular waveform, accordingly. That is, the signal that is output from the second ring oscillator 132 may have a second frequency f2.

In the present embodiment, the structure of the first ring oscillator 131 may be the same as the structure of the second ring oscillator 132. That is, the first NAND computation element NAND1 of the first ring oscillator 131 may be the same as the second NAND computation element NAND2 of the second ring oscillator 132, and the first inverter INV1 of the first ring oscillator 131 may be the same as the second inverter INV2 of the second ring oscillator 132. Here, the same structure does not mean exactly the same structure, but means that they are formed to have the same layout in the same process.

Referring to FIG. 3 again, the first ring oscillator 131 may be placed near the second ring oscillator 132. The first ring oscillator 131 and the second ring oscillator 132 may have similar characteristics, by being connected parallel to the semiconductor device 110 and placed near each other.

A test method of the semiconductor chip 100 will be described referring to FIGS. 5 to 9.

Figure 5:
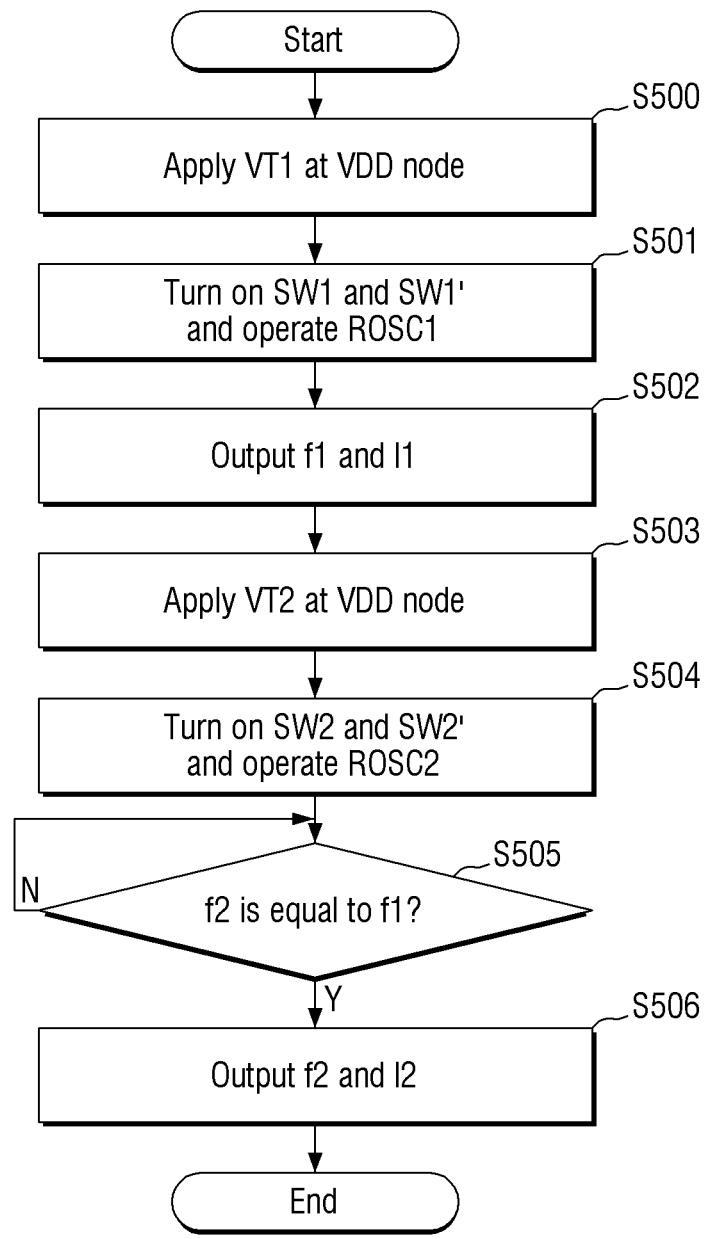
FIG. 5 is a flowchart of the operating method of the semiconductor chip according to some embodiments.
Figure 6:
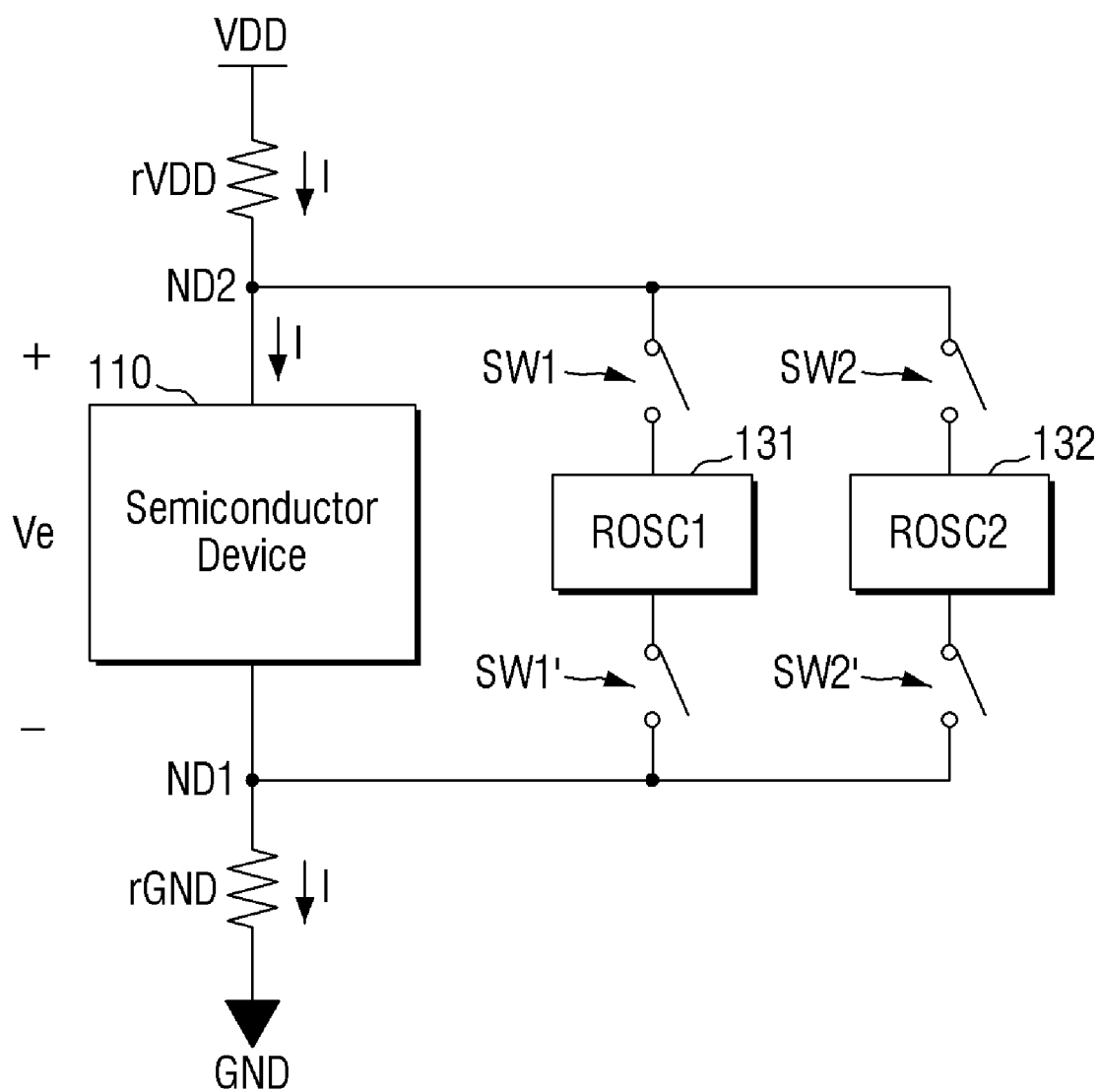
FIGS. 6 to 8 are diagrams for explaining the operating method of the semiconductor device and the IR drop measurer according to some embodiments.
Figure 7:
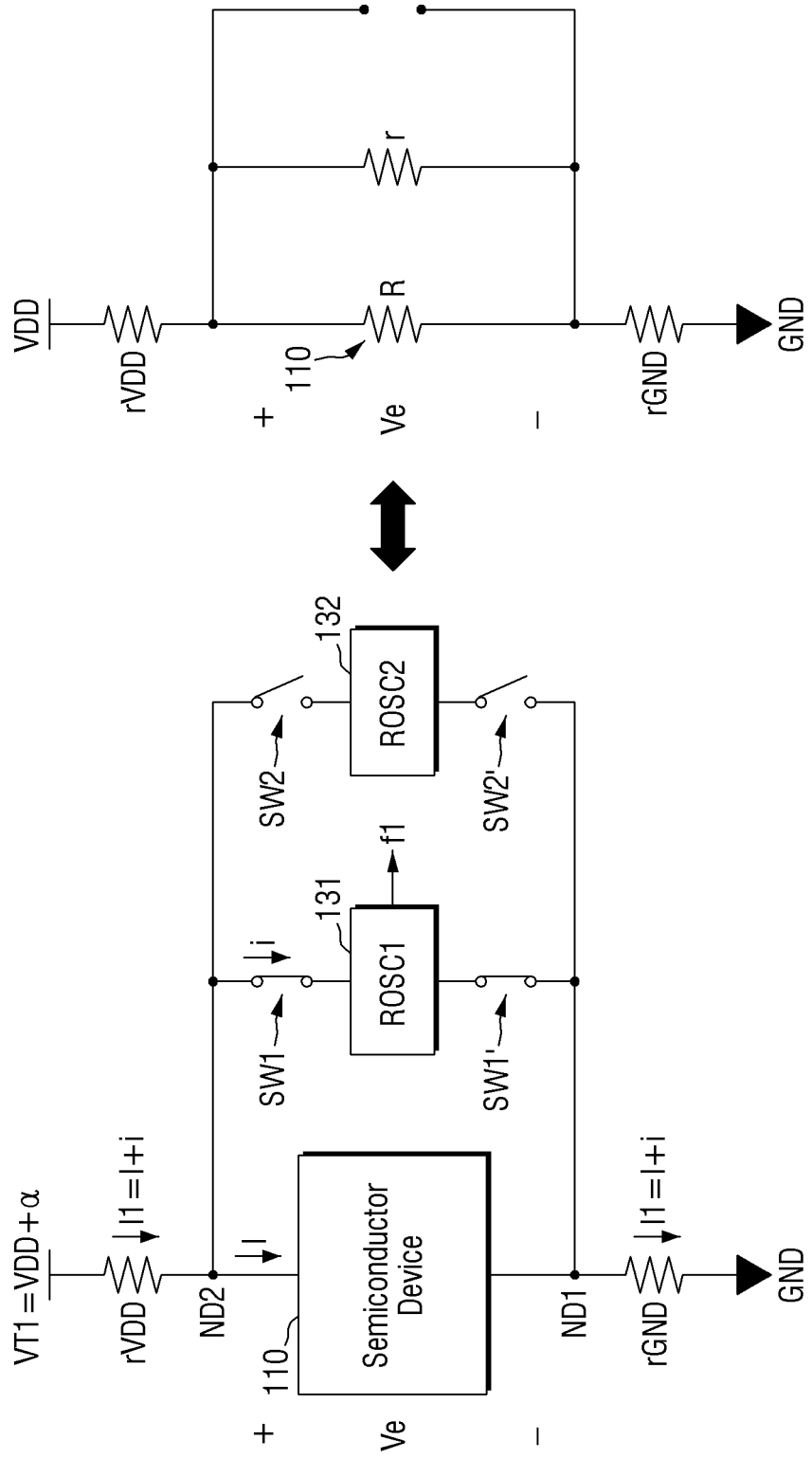
Figure 8:
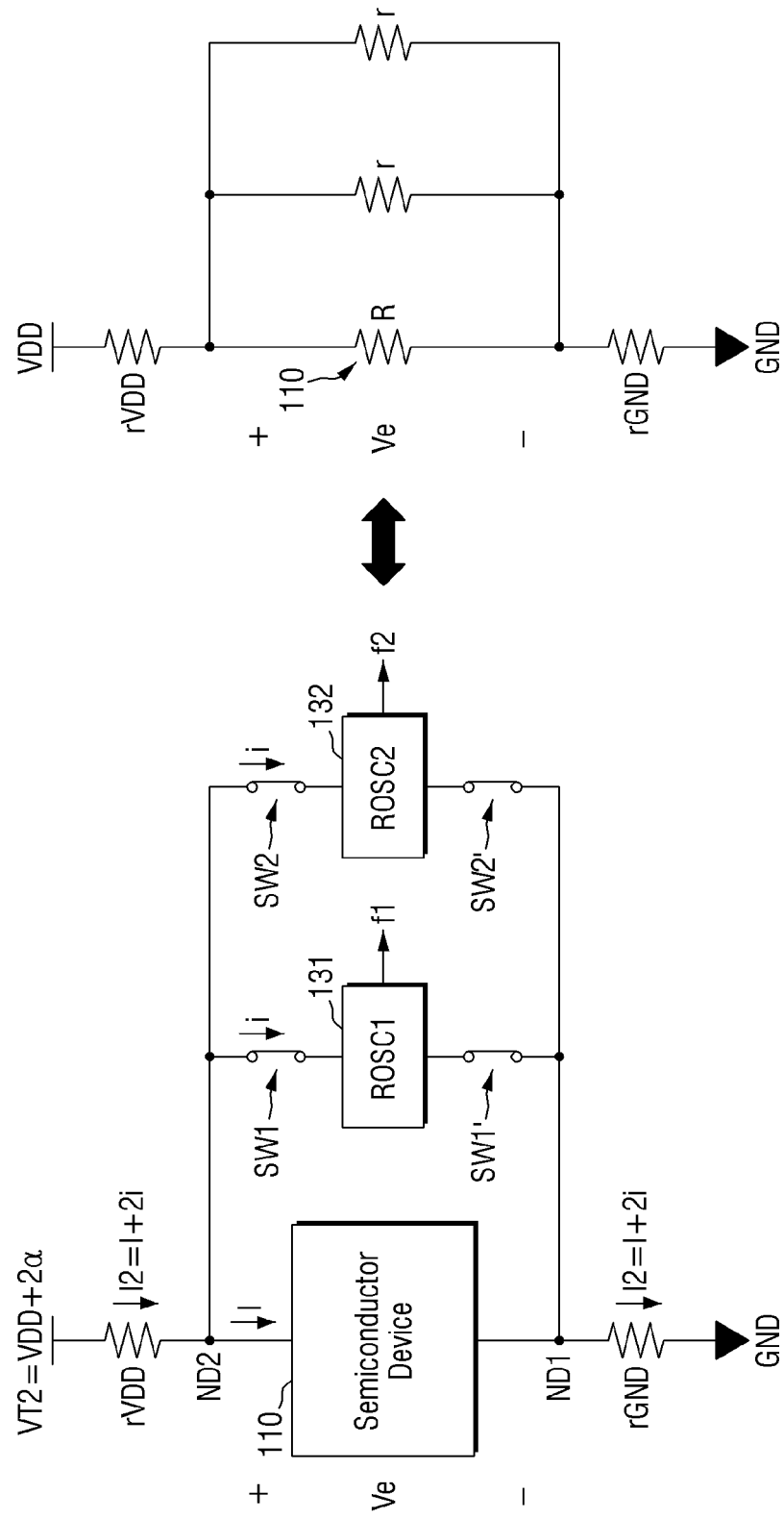

FIG. 5 is a flowchart of the operating method of the semiconductor chip according to some embodiments. FIGS. 6 to 8 are diagrams for explaining the operating method of the semiconductor device and the IR drop measurer according to some embodiments.

Referring to FIG. 6, the first switches SW1 and SW1' and the second switches SW2 and SW2' may be turned off. Therefore, the first ring oscillator 131 and the second ring oscillator 132 may not be connected to the first node ND1 and the second node ND2. That is, only the semiconductor device 110 may be connected to the first node ND1 and the second node ND2.

The power supply resistance rVDD, the semiconductor device 110, and the ground resistance rGND connected in series may be connected between the power supply voltage VDD and the ground voltage GND. Therefore, the power supply voltage VDD may be applied to the power supply resistance rVDD, the semiconductor device 110, and the ground resistance rGND. A basic current I may flow through the power supply resistance rVDD, the semiconductor device 110 and the ground resistance rGND. Here, the semiconductor device 110 may have a first resistance R. Therefore, a relation between the power supply voltage VDD, the basic current I, the power supply resistance rVDD, the semiconductor device 110, and the ground resistance rGND according to FIG. 6 is as shown in Formula 1 below.

$$VDD = I \cdot (rVDD + R + rGND) \qquad \text{<Formula 1>}$$

Further, the relation between the measured voltage Ve, the basic current I, and the first resistance R applied to the semiconductor device 110 is as shown in the following Formula 2.

$$Ve = I \cdot R \qquad \text{<Formula 2>}$$

Referring to FIGS. 5 and 7, the semiconductor chip 100 may apply a first test voltage VT1 to the node of the power supply voltage VDD (S500). That is, the first test voltage VT1 generated from the voltage generator 150 may be applied to one end of the power supply resistance rVDD. Here, a value of the first test voltage VT1 may be greater than a value of the power supply voltage VDD by a. Therefore, the first test voltage VT1 which is greater than the value of the power supply voltage VDD by a may be applied to the power supply resistance rVDD, the semiconductor device 110, and the ground resistance rGND.

Subsequently, the semiconductor chip 100 may turn on the first switch SW1 and the first switch SW1', and operate the first ring oscillator 131 (S501). As the first switch SW1 and the first switch SW1' are turned on, the first ring oscillator 131 may be connected to the first node ND1 and the second node ND2. Further, the first ring oscillator 131 may operate on the basis of the measured voltage Ve.

Since the first ring oscillator 131 operates on the basis of the measured voltage Ve, it may output a signal having the first frequency f1. When the first ring oscillator 131 outputs a signal having the first frequency f1, the first ring oscillator 131 may have a second resistance r. Further, a ring oscillator current i may flow through the first ring oscillator 131. A relation between the second resistance r, the measured voltage Ve, and the ring oscillator current i of the first ring oscillator 131 is as shown in the following Formula 3.

$$Ve = r \cdot i \qquad \text{<Formula 3>}$$

A first current I1 may flow through the power supply resistance rVDD and the ground resistance rGND. Here, the first current I1 may be the sum of the basic current I and the ring oscillator current i.

Further, the ring oscillator current i may be derived from a difference value between the first current I1 and the basic current I.

The IR drop measurer 130 may output data of the first frequency f1 and the first current I1 (S502). The data may be transferred to the test apparatus 200, but embodiments of the present disclosure are not limited thereto.

Referring to FIGS. 5 and 8, the semiconductor chip 100 may apply a second test voltage VT2 to the node of the power supply voltage VDD (S503). That is, the second test voltage VT2 generated from the voltage generator 150 may be applied to one end of the power supply resistance rVDD. Here, the value of the second test voltage VT2 may be greater than the value of the power supply voltage VDD by 2α. As a result, the second test voltage VT2, which is greater than the value of the power supply voltage VDD by 2α, may be applied to the power supply resistance rVDD, the semiconductor device 110, and the ground resistance rGND.

Subsequently, the semiconductor chip 100 may turn on the second switch SW2 and the second switch SW2', and operate the second ring oscillator 132 (S504). As the second switch SW2 and the second switch SW2' are turned on, the second ring oscillator 132 may be connected to the first node ND1 and the second node ND2. Further, the second ring oscillator 132 may operate on the basis of the measured voltage Ve. At this time, the first ring oscillator 131 may also be connected to the first node ND1 and the second node ND2. That is, the semiconductor device 110, the first ring oscillator 131, and the second ring oscillator 132 may be connected in parallel, and may be operated by the measured voltage Ve.

As the second ring oscillator 132 operates on the basis of the measured voltage Ve, it may output a signal having the second frequency f2. When the second ring oscillator 132 outputs a signal having the second frequency f2, the second ring oscillator 132 may have the second resistance r. Here, the second frequency f2 may be equal to the first frequency f1. That is, when the second ring oscillator 132 outputs a signal having the second frequency f2 equal to the first frequency f1, the second ring oscillator 132 may have the second resistance r value.

Further, the ring oscillator current i may flow through the second ring oscillator 132. That is, the current flowing through the first ring oscillator 131 and the second ring oscillator 132 may be equal to the ring oscillator current i. Even in this case, the current flowing through the semiconductor device 110 may be the basic current I. Further, the current flowing through the power supply resistance rVDD and the ground resistance rGND may be a second current I2.

The second current I2 may flow through the power supply resistance rVDD and the ground resistance rGND. Here, the second current I2 may be the sum of the basic current I and double the ring oscillator current i.

Further, the ring oscillator current i may be derived from a difference value between the second current I2 and the first current I1.

The semiconductor chip 100 determines whether the second frequency f2 is equal to the first frequency f1 (S505). When the second frequency f2 is not equal to the first frequency f1 (S505-N), the semiconductor chip 100 may continuously measure the second frequency f2 and operate the second ring oscillator 132.

When the second frequency f2 is equal to the first frequency f1 (S505-Y), the IR drop measurer 130 may output the data of the second frequency f2 and the second current I2 (S506). The data may be transferred to the test apparatus 200, but embodiments of the present disclosure are not limited thereto.

After the data is output from the IR drop measurer 130, the first switches SW1 and SW1' and the second switches SW2 and SW2' may be turned off, and the first ring oscillator 131 and the second ring oscillator 132 may not be connected to the first node ND1 and the second node ND2. That is, the semiconductor chip 100 may return to the status shown in FIG. 6.

Figure 9:
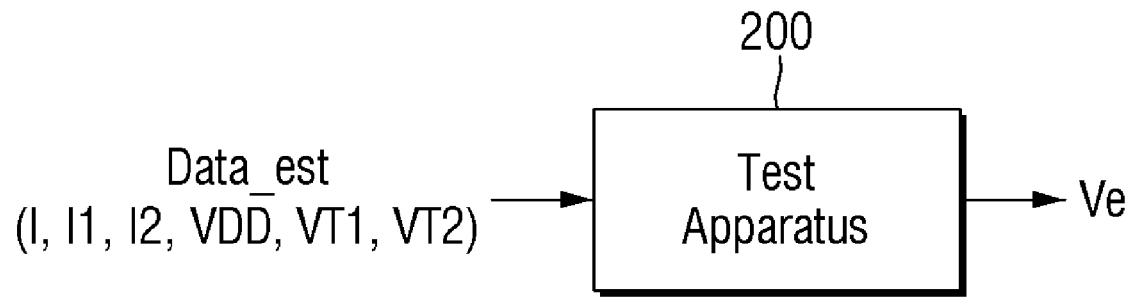
FIG. 9 is a diagram explaining an example in which the test apparatus according to some embodiments calculates the measured voltage.

FIG. 9 is a diagram explaining an example in which the test apparatus according to some embodiments calculates the measured voltage.

Referring to FIG. 9, the semiconductor chip 100 may provide a measured data Data_est to the test apparatus 200. Here, the measured data Data_est may include the value of the basic current I, the value of the first current I1, the value of the second current I2, the value of the power supply voltage VDD, the value of the first test voltage VT1, the value of the second test voltage VT2, and the like. The measured data Data_est may also include the value of the first frequency f1 and the value of the second frequency f2.

The test apparatus 200 may calculate the measured voltage Ve applied to the semiconductor device 110, on the basis of the value of the received basic current I, the value of the first current I1, the value of the second current I2, the value of the power supply voltage VDD, the value of the first test voltage VT1, the value of the second test voltage VT2, the value of the first frequency f1, and the value of the second frequency f2. That is, the test apparatus 200 may measure the IR drop on the semiconductor device 110 on the basis of the measured data Data_est.

A relation between the measured voltage Ve, the basic current I, the ring oscillator current i, the power supply resistance rVDD, and the ground resistance rGND in FIG. 7 is as shown in Formula 4 below.

$$Ve = VDD + \alpha - (rVDD + rGND) \cdot (I + i) \qquad \text{<Formula 4>}$$

The relation between the measured voltage Ve, the basic current I, the ring oscillator current i, the power supply resistance rVDD, and the ground resistance rGND in FIG. 8 is as shown in the following Formula 5.

$$Ve = VDD + \alpha - (rVDD + rGND) \cdot (I + 2i) \qquad \text{<Formula 5>}$$

Here, the ring oscillator current i may be derived from a difference between the second current I2 and the first current I1, and $\alpha$ may be derived from a difference between the second test voltage VT2 and the first test voltage VT1. A relation between a, the power supply resistance rVDD, the ground resistance rGND, and the ring oscillator current i derived from the Formulas 4 and 5 is as shown in the following Formula 6.

$$\alpha = (rVDD + rGND) \cdot i \qquad \text{<Formula 6>}$$

The sum of the values of the power supply resistance rVDD and the ground resistance rGND derived from this is as shown in the following Formula 7.

$$(rVDD + rGND) = \frac{\alpha}{i} \qquad \text{<Formula 7>}$$

Subsequently, the result of applying a voltage distribution formula to the measured voltage Ve in FIGS. 7 and 8 is as shown in Formulas 8 and 9.

$$Ve = (VDD + \alpha) \times \frac{(R//r)}{(rVDD + rGND) + (R//r)} \qquad \text{<Formula 8>}$$

$$Ve - (VDD + 2\alpha) \times \frac{\left(R//\frac{r}{2}\right)}{(rVDD + rGND) + \left(R//\frac{r}{2}\right)} \qquad \text{<Formula 9>}$$

The test apparatus 200 may derive r/R on the basis of the Formulas 7, 8, and 9. That is, r/R may have values of the power supply voltage VDD, the ring oscillator current i, and a. That is, r/R may be derived, using the two ring oscillators 131 and 132, even without probing the values of the power supply resistance rVDD, the ground resistance rGND, the first resistance R, and the second resistance r.

Next, referring to FIG. 6, the test apparatus 200 may calculate the measured voltage Ve. A relation between the measured voltage Ve, the power supply voltage VDD, the basic current I, the power supply resistance rVDD, and the ground resistance rGND is as shown in the following Formula 10.

$$Ve = VDD - I \cdot (rVDD + rGND) \qquad \text{<Formula 10>}$$

Further, the relation between the basic current I, the ring oscillator current i, the first resistance R, and the second resistance r is as shown in the following Formula 11.

$$Ve = I \cdot R = i \cdot r \qquad \text{<Formula 11>}$$

Results derived from the Formulas 7, 10 and 11 are as shown in Formula 12.

$$Ve = VDD - \frac{r}{R} \cdot i \cdot \frac{\alpha}{i} = VDD - \frac{r}{R} \cdot \alpha \qquad \langle \text{Formula 12} \rangle$$

Here, r/R was derived by the Formulas 7, 8 and 9, and the values of the power supply voltages VDD and a were derived during the test. Therefore, the test apparatus 200 may calculate the measured voltage Ve, using the measured data Data_est from the semiconductor chip 100, without performing the probing. Further, the test apparatus 200 may calculate the measured voltage Ve corresponding to the IR drop on the semiconductor device 110 and perform a feedback on the semiconductor chip 100, using the result thereof. This makes it possible to provide the semiconductor chip 100 that measures the IR drop on the semiconductor device 110, even without using a separate power supply or probing.

Hereinafter, a semiconductor chip 100' according to another embodiment will be described referring to FIG. 10.

Figure 10:
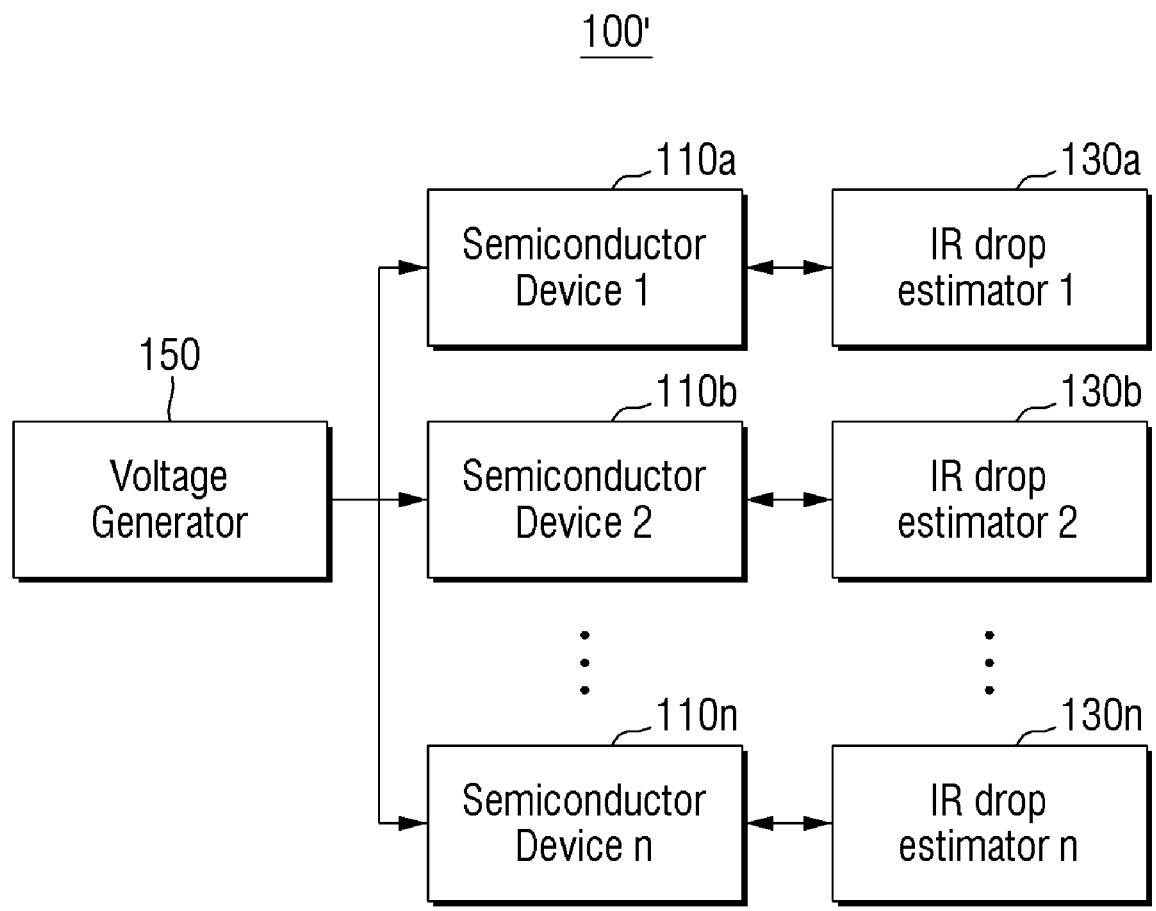
FIG. 10 is a block diagram of a semiconductor chip according to some embodiments.

FIG. 10 is a block diagram of a semiconductor chip according to some embodiments. For brevity and convenience, repeated parts of contents explained using FIGS. 1 to 9 may be briefly described or omitted.

Referring to FIG. 10, a semiconductor chip 100' may include a plurality of semiconductor devices 110a to 110n, a plurality of IR drop measurers 130a to 130n, and a voltage generator 150. The voltage generator 150 may provide the generated voltage to the plurality of semiconductor devices 110a to 110n and the plurality of IR drop measurers 130a to 130n.

A first IR drop measurer 130a may perform IR drop measurement on the first semiconductor device 110a. That is, the first IR drop measurer 130a may output the measured frequencies, measured voltages and measured currents to the first semiconductor device 110a, and the data may be provided to the test apparatus 200 and analyzed.

A second IR drop measurer 130b may perform IR drop measurement on the second semiconductor device 110b. That is, the second IR drop measurer 130b may output the measured frequencies, measured voltages and measured currents to the second semiconductor device 110b, and the data may be provided to the test apparatus 200 and analyzed.

An nth IR drop measurer 130n may perform IR drop measurement on an nth semiconductor device 110n. That is, the nth IR drop measurer 130n may output the measured frequencies, measured voltages and measured currents to the nth semiconductor device 110n, and the data may be provided to the test apparatus 200 and analyzed.

That is, the semiconductor chip 100' may independently perform the IR drop measurement on the plurality of semiconductor devices 110a to 110n, and the semiconductor chip 100' may be fed back, using the information.

Hereinafter, a semiconductor chip 100" according to another embodiment will be described referring to FIGS. 11 to 13.

Figure 11:
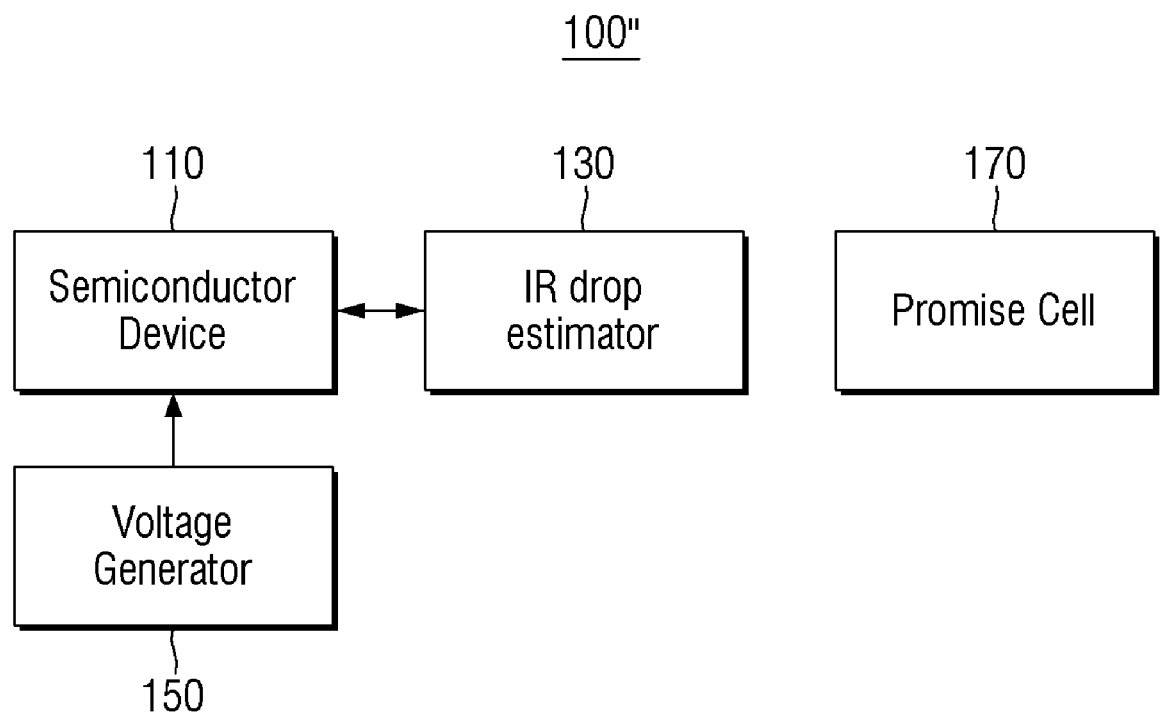
FIG. 11 is a block diagram of a semiconductor chip according to some embodiments.

FIG. 11 is a block diagram of the semiconductor chip according to some embodiments. FIG. 12 is a diagram of a process deviation monitoring circuit of FIG. 11. FIG. 13 is a flowchart of the operating method of the process deviation monitoring circuit of FIG. 11. For brevity and convenience, repeated parts of contents explained using FIGS. 1 to 9 may be briefly described or omitted.

Referring to FIG. 11, the semiconductor chip 100" may include a semiconductor device 110, an IR drop measurer 130, a voltage generator 150, and a process deviation monitoring circuit 170. Here, the process deviation monitoring circuit 170 may be placed apart or spaced apart from the semiconductor device 110, the IR drop measurer 130, and the voltage generator 150. However, the process deviation monitoring circuit 170 may be manufactured by the process of forming the configurations included in the semiconductor chip 100". For example, the process deviation monitoring circuit 170 may be manufactured at the same time as the semiconductor device 110 and the IR drop measurer 130.

The process deviation monitoring circuit 170 may exhibit the unique characteristics of the semiconductor chip 100". For example, the process deviation monitoring circuit in a semiconductor chip other than the semiconductor chip 100" may exhibit unique characteristics different from those of the process deviation monitoring circuit 170 of the semiconductor chip 100".

Figure 12:
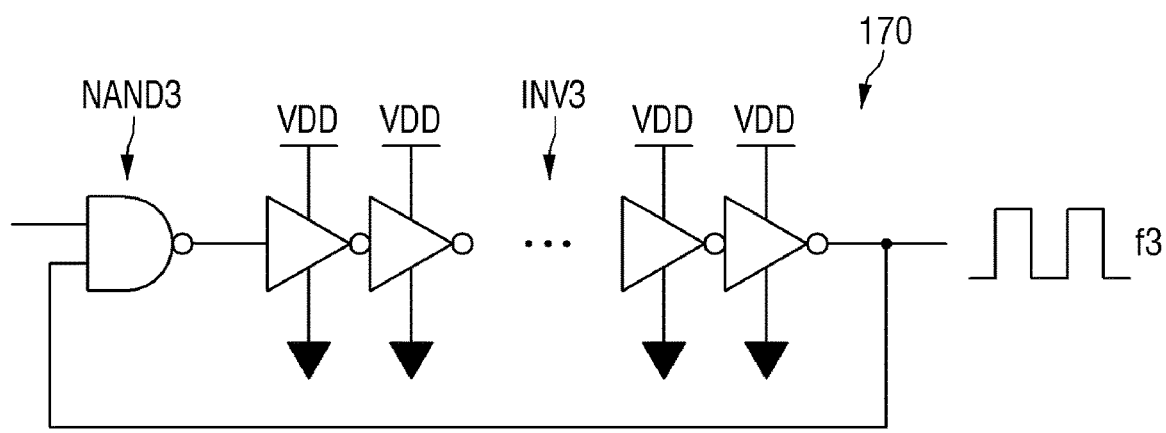
FIG. 12 is a diagram of a process deviation monitoring circuit of FIG. 11.

Referring to FIG. 12, the process deviation monitoring circuit 170 may include a third NAND computation element NAND3 and a plurality of third inverters INV3. The process deviation monitoring circuit 170 may operate on the basis of the power supply voltage VDD. The process deviation monitoring circuit 170 may output a signal having a third frequency f3.

Figure 13:
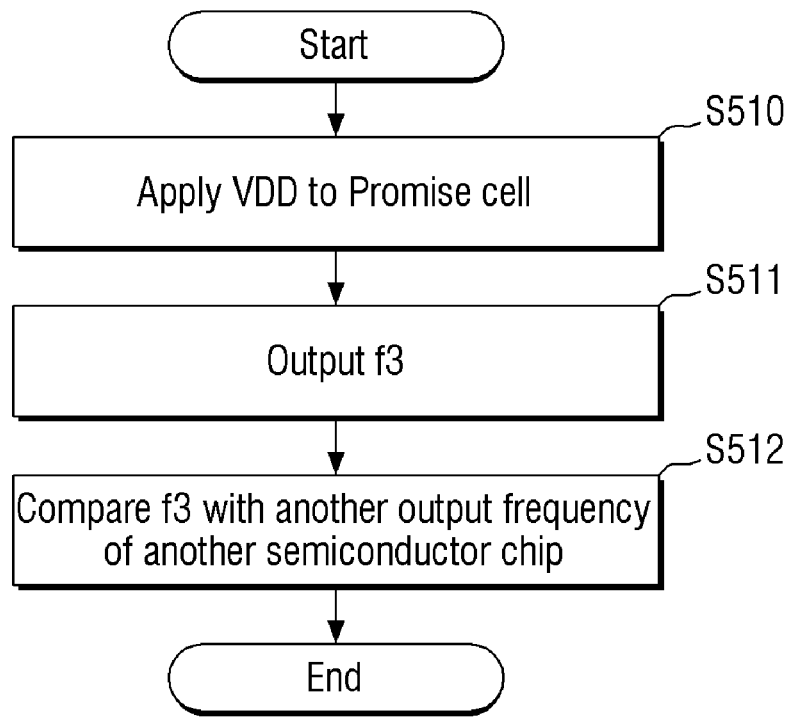
FIG. 13 is a flowchart of the operating method of the process deviation monitoring circuit of FIG. 11.

Referring to FIGS. 11 to 13, the semiconductor chip 100" may apply the power supply voltage VDD to the process deviation monitoring circuit 170 (S510). The process deviation monitoring circuit 170 may operate on the basis of the power supply voltage VDD, and the signal that is output from the process deviation monitoring circuit 170 may have the third frequency f3. The process deviation monitoring circuit 170 may output data about the value of the third frequency f3 (S511).

A semiconductor chip test apparatus may compare the output frequency of another semiconductor chip with the third frequency f3 (S512). Here, the output frequency of the process deviation monitoring circuit 170 is for process uniformity of each semiconductor chip.

That is, when the frequencies output from the semiconductor chips are the same, there is process uniformity of the manufactured semiconductor chips. However, when the frequencies output from the semiconductor chips are different, there is no process uniformity of the manufactured semiconductor chips. That is, the process deviation monitoring circuit 170 includes a ring oscillator, but may differ from the first and second ring oscillators 131 and 132 of the IR drop measurer 130. That is, the first and second ring oscillators 131 and 132 are placed apart or spaced apart from the process deviation monitoring circuit 170, perform other functions, and may be distinguished from the process deviation monitoring circuit 170.

Hereinafter, a semiconductor chip according to other embodiments will be described referring to FIGS. 14 to 16.

Figure 14:
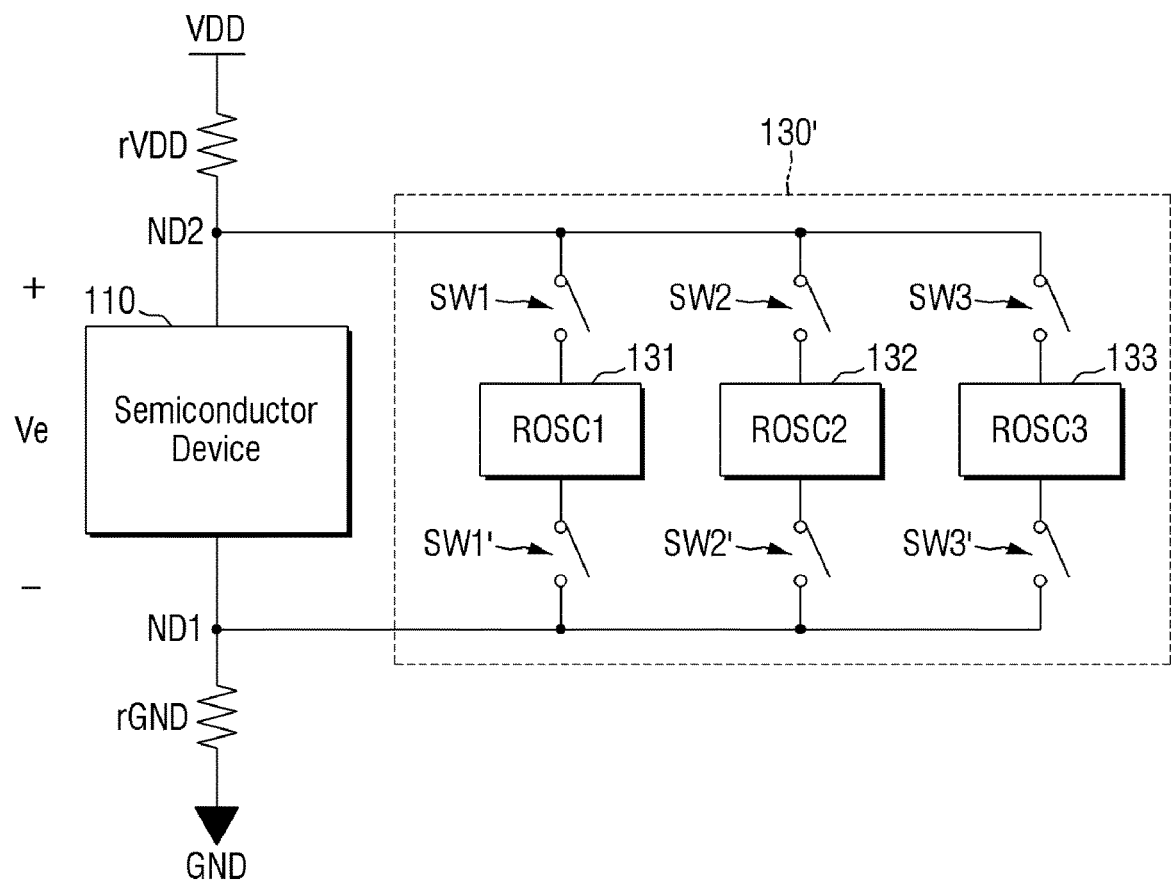
FIGS. 14 to 16 are diagrams for explaining the operating method of the semiconductor chip according to some embodiments.
Figure 15:
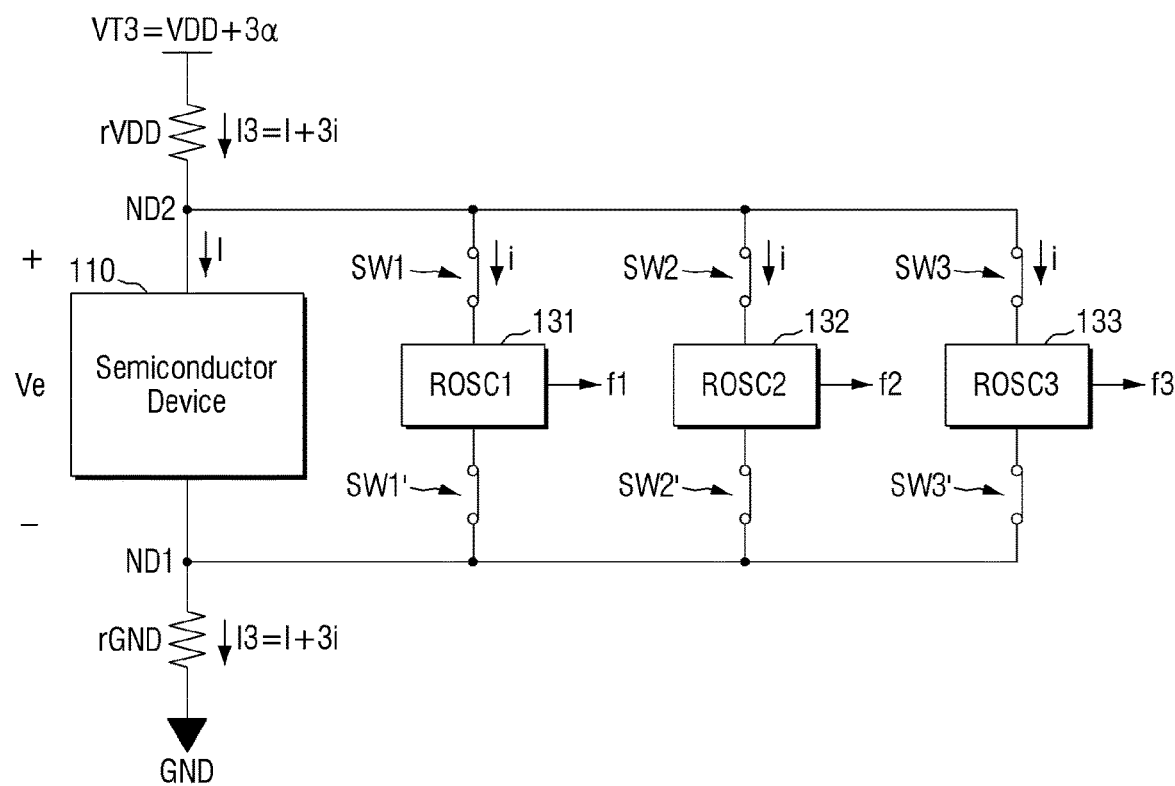
Figure 16:
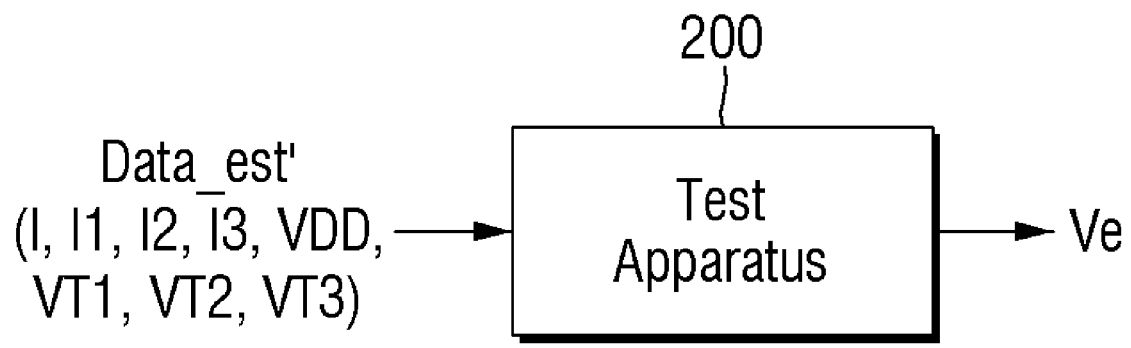

FIGS. 14 to 16 are diagrams for explaining the operating method of the semiconductor chip according to some embodiments. For brevity and convenience, repeated parts of contents explained using FIGS. 1 to 9 may be briefly described or omitted.

Referring to FIG. 14, an IR drop measurer 130' of the semiconductor chip may further include a third ring oscillator 133. Here, the third ring oscillator 133 may be connected to the first node ND1 and the second node ND2 by a third switch or third supply switch SW3 and a third switch or third ground switch SW3'. That is, the first to third ring oscillators 131 to 133 may be connected in parallel.

Referring to FIG. 15, when the first switches SW1 and SW1' are turned on at a first time, the first ring oscillator 131 may be connected to the first node ND1 and the second node ND2. At this time, the first ring oscillator 131 may output a signal having the first frequency f1, and the semiconductor chip 100 may provide data about the first frequency f1, the first test voltage VT1, and the first current I1 to the test apparatus 200.

When the second switches SW2 and SW2' are turned on at a second time subsequent to the first time, the second ring oscillator 132 may be connected to the first node ND1 and the second node ND2. At this time, the second ring oscillator 132 may output a signal having the second frequency f2, and the semiconductor chip 100 may provide data about the second frequency f2, the second test voltage VT2, and the second current I2 to the test apparatus 200. Here, the second frequency f2 may be equal to the first frequency f1.

When the third switch SW3 and SW3' are turned on at a third time subsequent to the second time, the third ring oscillator 133 may be connected to the first node ND1 and the second node ND2. At this time, the third ring oscillator 133 may output a signal having the third frequency f3. At this time, all the first to third ring oscillators 131 to 133 may operate. At this time, the third frequency f3 may be equal to the first frequency f1 and the second frequency f2. The semiconductor chip 100 may provide data about the third frequency f3, the third test voltage VT3, and the third current I3 to the test apparatus 200.

Here, the first to third ring oscillators 131 to 133 may have the same structure, and the first to third ring oscillators 131 to 133 may have the same resistance at each frequency.

Referring to FIG. 16, measured data Data_est' including the values of the basic current I, the first current I1, the second current I2, the third current I3, the power supply voltage VDD, the first test voltage VT1, the second test voltage VT2, and the third test voltage VT3 may be provided to the test apparatus 200. The test apparatus 200 may calculate the measured voltage Ve corresponding to the IR drop of the semiconductor device 110 on the basis of the values of the basic current I, the first current I1, the second current I2, the third current I3, the power supply voltage VDD, the first test voltage VT1, the second test voltage VT2, and the third test voltage VT3.

That is, the semiconductor chip 100 may measure the IR drop on the semiconductor device 110, using three ring oscillators.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor chip comprising:
   a semiconductor device connected between a first node to which a power supply voltage is applied and a second node to which a ground voltage is applied;
   a first ring oscillator connected to the first node through a first supply switch and the second node through a first ground switch; and
   a second ring oscillator separated from the first ring oscillator and connected to the first node through a second supply switch and the second node through a second ground switch,
   wherein the first supply and ground switches are configured to operate in response to a first control signal, thereby operating the first ring oscillator, and the second supply and ground switches are configured to operate in response to a second control signal, thereby operating the second ring oscillator,
   wherein when the semiconductor device and the first ring oscillator operate on the basis of a first voltage applied to the first and second nodes, a signal is output from the first ring oscillator that has a first frequency and the semiconductor chip is configured to output a first data including the first voltage and a first current that flows through the semiconductor device and the first ring oscillator, and
   when the semiconductor device, the first ring oscillator and the second ring oscillator operate on the basis of a second voltage applied to the first and second nodes, a signal is output from the second ring oscillator that has a second frequency and the semiconductor chip is configured to output a second data including the second voltage and a second current that flows through the semiconductor device, the first ring oscillator, and the second ring oscillator.

2. The semiconductor chip of claim 1, wherein the first frequency and the second frequency are the same.

3. The semiconductor chip of claim 2, wherein when the second voltage is applied to the semiconductor device, the first ring oscillator, and the second ring oscillator, the first ring oscillator is configured to output a signal having the first frequency.

4. The semiconductor chip of claim 3, wherein a first resistance of the first ring oscillator is the same as a second resistance of the second ring oscillator.

5. The semiconductor chip of claim 1, wherein when the first voltage is applied to the semiconductor device and the first ring oscillator, the second supply and ground switches are open.

6. The semiconductor chip of claim 1, wherein a level of the second voltage is higher than a level of the first voltage, and a level of the second current is higher than a level of the first current.

7. The semiconductor chip of claim 1, further comprising:
   a third ring oscillator connected to the first node through a third supply switch and the second node through a third ground switch.

8. The semiconductor chip of claim 7, wherein when the semiconductor device and the first to third ring oscillators operate on the basis of a third voltage provided from a voltage generator, a signal is output from the third ring oscillator that has a third frequency and the semiconductor chip is configured to output a third data including the third voltage and a third current that flows through the semiconductor device and the first to third ring oscillators.

9. The semiconductor chip of claim 8, wherein the first to third frequencies are the same, the first to third ring oscillators have the same structure, and resistances of the first to third ring oscillators are the same.

10. A test method of a semiconductor chip, the method comprising:
    providing a semiconductor chip comprising:
      a first semiconductor device connected between a first node and a second node;
      a first ring oscillator connected to the first node through a first supply switch and the second node through a first ground switch;
      a second ring oscillator connected to the first node through a second supply switch and the second node through a second ground switch;
      a second semiconductor device connected to a third node and a fourth node;
      a third ring oscillator connected to the third node and the fourth node; and a fourth ring oscillator connected to the third node and the fourth node, operating the first supply and ground switches in response to a first control signal to thereby operate the first ring oscillator, outputting a first current flowing through the first semiconductor device and the first ring oscillator, and a first frequency of a signal output from the first ring oscillator, in response to application of a first test voltage to the first node and application of a ground voltage to the second node, operating the second supply and ground switches in response to a second control signal to thereby operate the second ring oscillator, wherein the first ring oscillator and the second ring oscillator operate concurrently and are connected in parallel, outputting a second current flowing through the first semiconductor device, the first ring oscillator, and the second ring oscillator, and a second frequency of a signal output from the second ring oscillator, in response to application of a second test voltage to the first node and application of the ground voltage to the second node, and calculating an IR drop on the first semiconductor device, on the basis of the first test voltage, the second test voltage, the first current, the second current, the first frequency, and the second frequency, the method further comprising:

outputting a third current flowing through the second semiconductor device and the third ring oscillator, and a third frequency of a signal output from the third ring oscillator, in response to application of a third test voltage to the third node and application of the ground voltage to the fourth node, outputting a fourth current flowing through the second semiconductor device, the third ring oscillator and the fourth ring oscillator, and a fourth frequency of the signal output from the fourth ring oscillator, in response to application of a fourth test voltage to the third node and application of the ground voltage to the fourth node, and calculating an IR drop on the second semiconductor device, on the basis of the third test voltage, the fourth test voltage, the third current, the fourth current, the third frequency, and the fourth frequency.

11. The test method of the semiconductor chip of claim 10, wherein calculating the IR drop on the first semiconductor device includes calculating the IR drop on the first semiconductor device, on the basis of the first test voltage, the second test voltage, the first current and the second current, when the first frequency and the second frequency are the same.

12. The test method of the semiconductor chip of claim 11, wherein calculating the IR drop on the first semiconductor device includes calculating the IR drop on the first semiconductor device, on the basis of a difference value between the first and second test voltages and a difference value between the first and second currents.

13. The test method of the semiconductor chip of claim 10, wherein a first resistance of the first ring oscillator is equal to a second resistance of the second ring oscillator.

14. The test method of the semiconductor chip of claim 10, wherein a level of the second test voltage is higher than a level of the first test voltage, and a level of the second current is higher than a level of the first current.

15. A semiconductor chip comprising:

a semiconductor device;

an IR drop measurer including a plurality of ring oscillators connected to the semiconductor device; and a process deviation monitoring circuit spaced apart from the semiconductor device and the plurality of ring oscillators, wherein when a frequency of a signal output from a first ring oscillator among the plurality of ring oscillators is a first frequency, the IR drop measurer is configured to output a first voltage applied to the semiconductor device and the first ring oscillator, and a flowing first current through the semiconductor device and the first ring oscillator, the process deviation monitoring circuit is configured to output a signal having a second frequency different from the first frequency in response to the applied first voltage, when a frequency of a signal output from a second ring oscillator among the plurality of ring oscillators is the first frequency, the IR drop measurer is configured to output a second voltage applied to the semiconductor device, the first ring oscillator, and the second ring oscillator, and a flowing second current through the semiconductor device, the first ring oscillator, and the second ring oscillator, and wherein the first ring oscillator and the second ring oscillator are configured to operate concurrently and are connected in parallel.

16. The semiconductor chip of claim 15, wherein a voltage value applied to the semiconductor device is calculated on the basis of the first voltage, the second voltage, the first current, and the second current.

17. The semiconductor chip of claim 15, wherein the process deviation monitoring circuit includes a ring oscillator different from the plurality of ring oscillators.

* * * * *